(12) United States Patent
Ooyagi et al.

(10) Patent No.: US 6,998,817 B2
(45) Date of Patent: Feb. 14, 2006

(54) CHARGE CONTROL CIRCUIT AND METHOD OF ADJUSTING VOLTAGE FOR DETECTING FULL CHARGE OF SECONDARY BATTERY IN SAME

(75) Inventors: Mitsuru Ooyagi, Saitama (JP); Hideo Matsuki, Saitama (JP)

(73) Assignee: Sanyo Electric Co., Ltd., Osaka (JP)

( * ) Notice: Subject to any disclaimer, the term of this patent is extended or adjusted under 35 U.S.C. 154(b) by 289 days.

(21) Appl. No.: 10/680,978

(22) Filed: Oct. 7, 2003

(65) Prior Publication Data
US 2004/0119443 A1 Jun. 24, 2004

(30) Foreign Application Priority Data
Oct. 7, 2002 (JP) ............................. 2002-293272

(51) Int. Cl.
*H01M 10/44* (2006.01)
*H01M 10/46* (2006.01)

(52) U.S. Cl. .................................... 320/132
(58) Field of Classification Search ............... 320/132, 320/136, 149, 163
See application file for complete search history.

(56) References Cited

U.S. PATENT DOCUMENTS

| 5,463,305 A | * | 10/1995 | Koenck ...................... 320/145 |
| 5,488,284 A | * | 1/1996 | Dias et al. .................. 320/162 |
| 6,222,370 B1 | * | 4/2001 | Schousek et al. ........... 324/436 |

FOREIGN PATENT DOCUMENTS

JP      11-332121      11/1999

* cited by examiner

*Primary Examiner*—Edward H. Tso
(74) *Attorney, Agent, or Firm*—SoCal IP Law Group LLP; Steven C. Sereboff

(57) ABSTRACT

In a charge control circuit comprising a full charge detection voltage supply device supplying a predetermined full charge detection voltage for detecting a full charge status; and a comparator including a charge status voltage input unit to which is inputted a charge status voltage indicative of the charge status of a secondary battery and a full charge detection voltage input unit to which the full charge detection voltage is inputted, the comparator outputting a result of a comparison between the charge status voltage and the full charge detection voltage, the charge control circuit further comprises an external terminal connected to the full charge detection voltage input unit of the comparator and for adjusting the full charge detection voltage, with an electronic component for adjusting the full charge detection voltage being connectable to the external terminal.

8 Claims, 1 Drawing Sheet

CHARGE CONTROL CIRCUIT AND METHOD OF ADJUSTING VOLTAGE FOR DETECTING FULL CHARGE OF SECONDARY BATTERY IN SAME

CROSS-REFERENCE TO RELATED APPLICATIONS

This application claims priority upon Japanese Patent Application No. 2002-293272 filed on Oct. 7, 2002 in Japan, which is herein incorporated by reference.

BACKGROUND OF THE INVENTION

1. Field of the Invention

The present invention relates to a charge control circuit and a method of adjusting a voltage detecting the full charge of a secondary battery in the charge control circuit.

2. Description of the Related Art

A lithium-ion secondary battery has a remarkably large charge capacity compared to a nickel-cadmium battery or a nickel-hydrogen battery. It is used widely for various uses such as batteries in laptop PCs and mobile phones utilizing such a characteristic. Similarly to a nickel-cadmium battery and a nickel-hydrogen battery, a lithium-ion secondary battery can not detect its full charge by detecting the peak voltage of the battery while being charged or a $\Delta V$ voltage drop from the peak voltage. Therefore, a lithium-ion secondary battery detects its full charge by detecting its battery voltage precisely. Thus, when the battery voltage has reached a predetermined voltage, it is determined that the battery is fully charged and the charging is terminated.

In a charge control circuit targeting such a lithium-ion secondary battery, a voltage being set for detecting the full charge status (hereinafter, "full charge detection voltage") is fixed (see, for example, Japanese Patent Application Laid-open Publication No. Hei11-332121).

Since the full charge detection voltage is fixed, it is not possible to fine-adjust a full charge detection voltage in order to make the voltage suitable for the charge level of each type of battery and of each respective battery.

For example, a full charge detection voltage that does not degrade the performance of a secondary battery is a full charge detection voltage at which the secondary battery is maintained such that the battery is not over-charged and not over-discharged. In this way, the full charge detection voltage that does not degrade the battery performance differs by the type of the secondary battery and is not always constant. For example, it is most suitable for a lithium-ion secondary battery to have its full charge detection voltage set at a voltage that does not degrade its performance, ranging 4.1–4.2V/cell.

SUMMARY OF THE INVENTION

In order to overcome the above deficiencies, according to a major aspect of the present invention there is provided a charge control circuit comprising full charge detection voltage supply device supplying a predetermined full charge detection voltage for detecting a full charge status; a comparator including a charge status voltage input unit to which is inputted a charge status voltage indicative of the charge status of a secondary battery, and a full charge detection voltage input unit to which the full charge detection voltage is inputted, the comparator outputting a result of a comparison between the charge status voltage and the full charge detection voltage; and an external terminal connected to the full charge detection voltage input unit of the comparator for adjusting the full charge detection voltage, wherein an electronic component for adjusting the full charge detection voltage is connectable to the external terminal.

Other features than the above of the present invention will become apparent from the descriptions of this specification and the accompanying drawings.

DETAILED DESCRIPTION OF THE INVENTION

Figure 1:
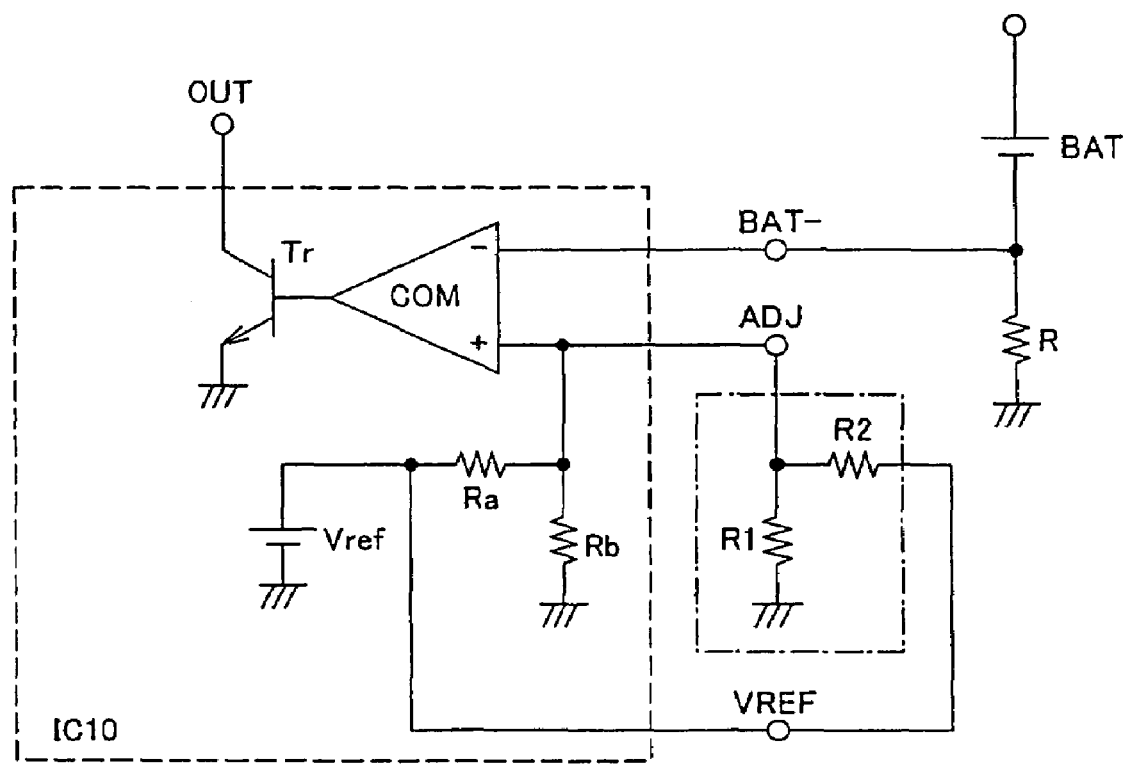
FIG. 1 is a block diagram showing one embodiment according to the invention.

At least the following items will become clear from descriptions of the specification and of the accompanying drawing.

A charge control circuit according to an embodiment comprises full charge detection voltage supply portion for supplying a predetermined full charge detection voltage for detecting a full charge status; a comparator which includes a charge status voltage input unit to which is inputted a charge status voltage indicative of the charge status of a secondary battery, and a full charge detection voltage input unit to which the full charge detection voltage is inputted, the comparator outputting a result of a comparison between the charge status voltage and the full charge detection voltage; and an external terminal connected to the full charge detection voltage input unit of the comparator for adjusting the full charge detection voltage, wherein an electronic component is connectable to the external terminal for adjusting the full charge detection voltage.

The electronic component can be a resistor.

One end of the resistor can be connected to the external terminal, with the other end of the resistor being connected to the ground.

An adjusting method according to the embodiment is a method of adjusting a voltage detecting a full charge of a secondary battery in a charge control circuit, the charge control circuit comprising a comparator which includes a charge status voltage input unit to which is inputted a charge status voltage indicative of the charge status of the secondary battery, and a full charge detection voltage input unit to which is inputted a predetermined full charge detection voltage for detecting the full charge status, the comparator outputting a result of a comparison between the charge status voltage and the full charge detection voltage, wherein an external terminal for adjusting the full charge detection voltage is connected to the full charge detection voltage input unit of the comparator, the full charge detection voltage being adjusted by connecting an electronic component to the external terminal.

The electronic component can be a resistor.

One end of the resistor can be connected to the external terminal, with the other end of the resistor being connected to the ground.

A reference voltage source for generating the full charge detection voltage can be connected with a reference voltage terminal, with one end of the resistor being connected to the external terminal, and with the other end of the resistor being connected to the reference voltage terminal.

The resistor may include a first resistor element and a second resistor element, and the reference voltage source for generating the full charge detection voltage can be connected with the reference voltage terminal, with one end of the first resistor element being connected to the external terminal and the other end of the first resistor element connected to the ground, and with one end of the second resistor element being connected to the external terminal and the other end of the second resistor element connected to the reference voltage terminal.

EXAMPLES

FIG. 1 shows a charge control circuit according to the embodiment. As shown in FIG. 1, the charge control circuit includes an IC (Integrated Circuit) 10 surrounded by the dotted line in the FIGURE. A secondary battery BAT is connected to one end of a resistor R for detecting the charge status of the secondary battery BAT. The other end of the resistor R is grounded. The connecting point of the secondary battery BAT and the resistor R is connected to an input terminal BAT– as an external pin of the IC 10. The input terminal BAT– is connected to a negative input terminal (inversion input, charge status voltage input unit) of a comparator COM.

A positive input terminal (non-inversion input, full charge detection voltage input unit) of the comparator COM is connected in common with each one end of a resistor Ra and a resistor Rb. The other end of the resistor Ra is connected to a reference voltage (reference voltage source) Vref. The other end of the resistor Rb is grounded. The reference voltage Vref, the resistor Ra and the resistor Rb constitute a device for supplying a voltage (full charge detection voltage) for detecting the full charge status of the secondary battery BAT. The reference voltage Vref is realized by a well-known reference voltage generation circuit, for example, as shown in FIG. 1 in Japanese Patent Application Laid-open Publication No. Hei11-332121. The reference voltage Vref is connected to a reference voltage terminal VREF as an external pin of the IC 10. The positive input terminal (+) is connected to an external terminal ADJ for adjusting the full charge detecting voltage as an external pin of the IC 10. An output terminal of this comparator COM is connected to the base of a transistor Tr. The emitter of the transistor Tr is grounded and its collector is connected to an external terminal OUT as an external pin of the IC 10.

In such a configuration, a charge current of the secondary battery BAT flows through the resistor R and the voltage generated by the voltage drop of the resistor R is applied to the negative input terminal (–) of the comparator COM through the input terminal BAT– as a charge status voltage indicating the charge status of the secondary battery. On the other hand, the full charge detecting voltage obtained by dividing the reference voltage Vref by the resistor Ra and the resistor Rb is applied to the positive input terminal (+) of the comparator COM. The comparator COM outputs to the base of the transistor Tr the result of a comparison of the charge status voltage and the full charge detection voltage that have been inputted thereto.

Under the status where the full charge has not been attained after charging the secondary battery BAT has been started, the output of the comparator COM is "high". Therefore, the transistor Tr becomes "ON" and the external terminal OUT is grounded. Then, when the secondary battery BAT attains the full charge status, the output of the comparator COM becomes "low". Therefore, the transistor Tr becomes "OFF" and the external terminal OUT is no longer grounded.

The external terminal OUT is connected to, for example, an LED lamp in series with a power source. The LED lamp is adapted to be switched to being turned on or being turned off in response to being grounded or not grounded of the external terminal OUT, indicating whether or not the battery is in the full charge status. Otherwise, a plurality of LED lamps having different colors from each other are used and whether or not the battery is in the full charge status is indicated by the color of an LED lamp being turned on. Furthermore, the external terminal OUT is connected to an input terminal of a microcomputer for monitoring the charge status, and the control of turning on and off of the LED lamps can be executed by this microcomputer.

In this example, a suitable electronic component for adjusting the full charge detection voltage is externally connected to the external terminal ADJ. For example, as shown in FIG. 1, one end of a resistor R1 of which the other end is grounded is connected to the external terminal ADJ. Then, a circuit is formed having a configuration in which the resistor Rb and the resistor R1 are respectively connected in parallel with a series circuit of the resistor Ra and the reference voltage Vref. Therefore, by setting properly the resistance of the externally connected resistor R1, the full charge detection voltage can be adjusted. Furthermore, in addition to this configuration, for example, as shown in FIG. 1, one end of a resistor R2 being an external part is connected to the external terminal ADJ as well as the other end of the resistor R2 is connected to the reference voltage Vref through the external terminal VREF. Thus, by setting properly not only the resistance of the resistor R1 but also the resistance of the resistor R2 respectively, the full charge detection voltage can be more precisely fine-adjusted.

With the adjusting function for the full charge detection voltage, the full charge detection voltage can be fine-adjusted to accommodate the charge levels of various types of batteries including a lithium-ion secondary battery as well as of each respective battery.

[Others]

Though the charge control circuit according to the embodiment as described above has been described focusing on the full charge detection circuit system, the known circuit systems such as a constant current control circuit, a constant voltage control circuit and a low voltage detection circuit are included. The outputs of the constant current control circuit, the constant voltage control circuit and the low voltage detection circuit are applied to the base of the transistor undertaking the switching function. Then, the connection of the power source for charging with the positive terminal of the secondary battery BAT is controlled by turning on or off this transistor. Thereby, the charge process of the secondary battery BAT is controlled.

In this embodiment, the following effects can be obtained.

The full charge detection voltage can be controlled by an electronic component such as a resistor connected to an external terminal. Thereby, the range of the setting of the full charge detection voltage can be expanded. Furthermore, the full charge detection voltage can be fine-adjusted to accommodate the charge level of various types of batteries as well as each respective battery. Therefore, even an IC in which the charge control circuit according to the invention is integrated in a chip can fine-adjust the full charge detection voltage by connecting a desired electronic component such as a resistor with an external terminal of the IC. The invention can promote the employment of the IC in which the charge control circuit is integrated in a chip.

Although the embodiment of the invention has been described in detail based on an example thereof, the invention is not limited to the example but could variously be modified without departing from the scope and spirit of the invention.

What is claimed is:

1. A charge control circuit comprising:
    a full charge detection voltage supply device supplying a predetermined full charge detection voltage for detecting a full charge status; and
    a comparator including a charge status voltage input unit to which is inputted a charge status voltage indicative of the charge status of a secondary battery, and a full charge detection voltage input unit to which the full charge detection voltage is inputted, the comparator outputting a result of a comparison between the charge status voltage and the full charge detection voltage; and
    an external terminal connected to the full charge detection voltage input unit of the comparator, and for adjusting the full charge detection voltage,
    wherein an electronic component for adjusting the full charge detection voltage is connectable to the external terminal.

2. A charge control circuit according to claim 1, wherein the electronic component is a resistor.

3. A charge control circuit according to claim 2, wherein one end of the resistor is connected to the external terminal, with the other end of the resistor being connected to the ground.

4. A method of adjusting a voltage detecting a full charge of a secondary battery in a charge control circuit, the charge control unit comprising a comparator including a charge status voltage input unit to which is inputted a charge status voltage indicative of the charge status of the secondary battery, and a full charge detection voltage input unit to which is inputted a predetermined full charge detection voltage for detecting the full charge status, the comparator outputting a result of a comparison between the charge status voltage and the full charge detection voltage, wherein
    an external terminal for adjusting the full charge detection voltage is connected to the full charge detection voltage input unit of the comparator, the adjusting method comprising:
    adjusting the full charge detection voltage by connecting an electronic component to the external terminal.

5. A method of adjusting a voltage detecting a full charge of a secondary battery according to claim 4, wherein the electronic component is a resistor.

6. A method of adjusting a voltage detecting a full charge of a secondary battery according to claim 5, wherein one end of the resistor is connected to the external terminal, with the other end of the resistor being connected to the ground.

7. A method of adjusting a voltage detecting a full charge of a secondary battery according to claim 5, wherein
    a reference voltage terminal is connected to a reference voltage source for generating the full charge detection voltage, and wherein
    one end of the resistor is connected to the external terminal, with the other end of the resistor being connected to the reference voltage terminal.

8. A method of adjusting a voltage detecting a full charge of a secondary battery according to claim 5, wherein
    the resistor includes a first resistor element and a second resistor element, with a reference voltage terminal being connected to a reference voltage source for generating the full charge detection voltage,
    one end of the first resistor element being connected to the external terminal with the other end of the first resistor element connected to the ground, and one end of the second resistor element being connected to the external terminal with the other end of the second resistor element connected to the reference voltage terminal.

* * * * *